(12) United States Patent
Kanda et al.

(10) Patent No.: US 7,863,987 B2
(45) Date of Patent: Jan. 4, 2011

(54) CLOCK SIGNAL GENERATING AND DISTRIBUTING APPARATUS

(75) Inventors: Kouichi Kanda, Kawasaki (JP); Hirotaka Tamura, Kawasaki (JP); Hisakatsu Yamaguchi, Kawasaki (JP); Junji Ogawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/386,789

(22) Filed: Mar. 23, 2006

(65) Prior Publication Data
US 2007/0063779 A1    Mar. 22, 2007

(30) Foreign Application Priority Data
Sep. 16, 2005    (JP) .............................. 2005-271058

(51) Int. Cl.
*H03B 5/18*    (2006.01)
*H03B 9/14*    (2006.01)

(52) U.S. Cl. ............................... 331/2; 331/47; 331/55; 331/56; 331/117 R

(58) Field of Classification Search ............. 331/117 R, 331/167, 2, 46, 47, 55, 56, 17 FE, 172
See application file for complete search history.

(56) References Cited

U.S. PATENT DOCUMENTS

| 6,175,285 | B1 * | 1/2001 | Gabara | 331/117 R |
| 6,617,936 | B2 * | 9/2003 | Dally et al. | 331/57 |
| 6,683,503 | B2 * | 1/2004 | Mizuno et al. | 331/46 |
| 7,155,188 | B2 | 12/2006 | Noboru et al. | |
| 7,336,135 | B2 * | 2/2008 | Higashi et al. | 331/108 B |

FOREIGN PATENT DOCUMENTS

| JP | 07-221546 | 8/1995 |
| JP | 11-74762 | 3/1999 |
| JP | 11-74762 A | 3/1999 |
| JP | 2002-026696 | 1/2002 |
| JP | 2002-135114 | 5/2002 |
| JP | 2003-110425 | 4/2003 |

OTHER PUBLICATIONS

Partial translation of Notice of Rejection Ground for corresponding Japanese Patent Application issued Oct. 21, 2008.

* cited by examiner

*Primary Examiner*—Robert Pascal
*Assistant Examiner*—Levi Gannon
(74) *Attorney, Agent, or Firm*—Arent Fox LLP

(57) ABSTRACT

LC resonant voltage control oscillators are adopted as voltage control oscillators for the purpose of providing a clock generating and distributing apparatus that can generate and distribute a clock signal of high precision even in a high-frequency region of several giga hertz or higher, and of providing a distributive VCO-type clock generating and distributing apparatus in which voltage control oscillators oscillate in the same phase, and which can generate a clock signal of a desired frequency and distributes a high-frequency clock signal to each part within a chip more stably even in a high-frequency region reaching 20 GHz. Furthermore, an inductor component of a wire connecting the oscillation nodes of the oscillators is made relatively small, or the LC resonant oscillators are oscillated in synchronization by using injection locking, whereby the LC resonant voltage control oscillators stably oscillate in the same phase.

1 Claim, 17 Drawing Sheets

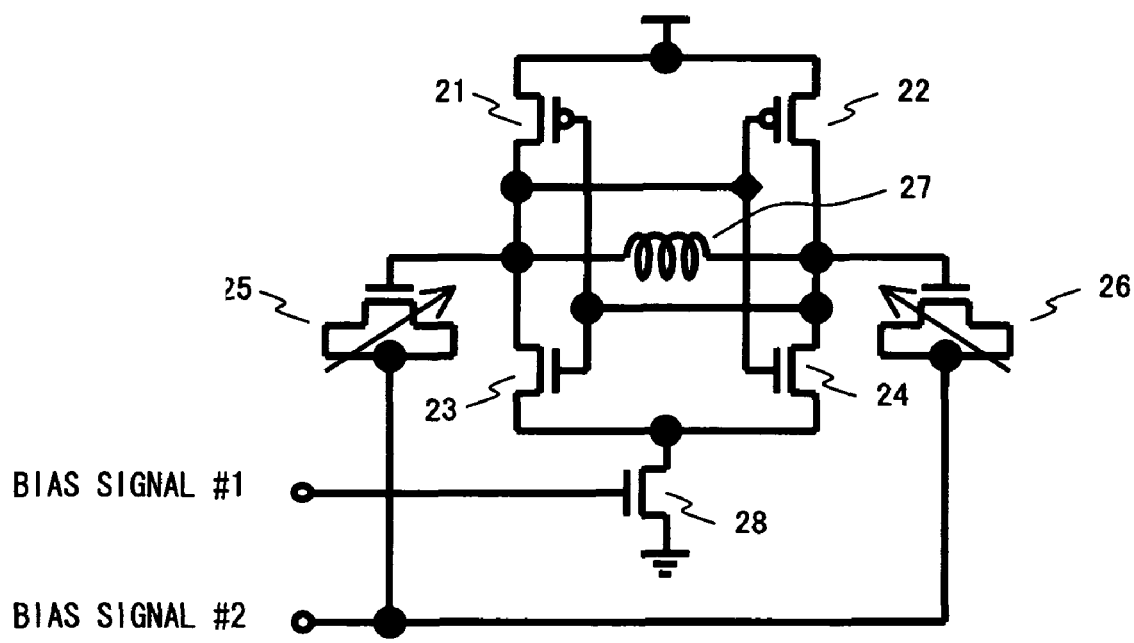
F I G. 5 A

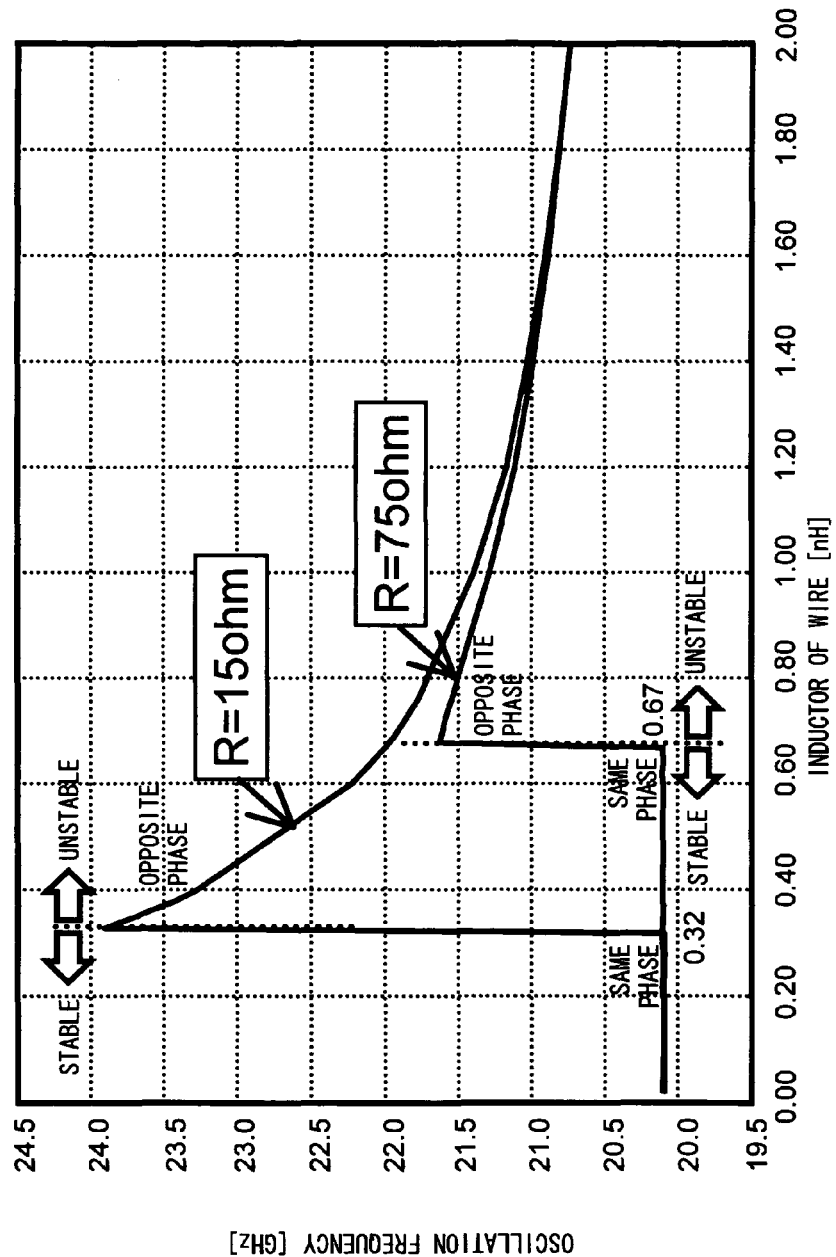
F I G. 5B

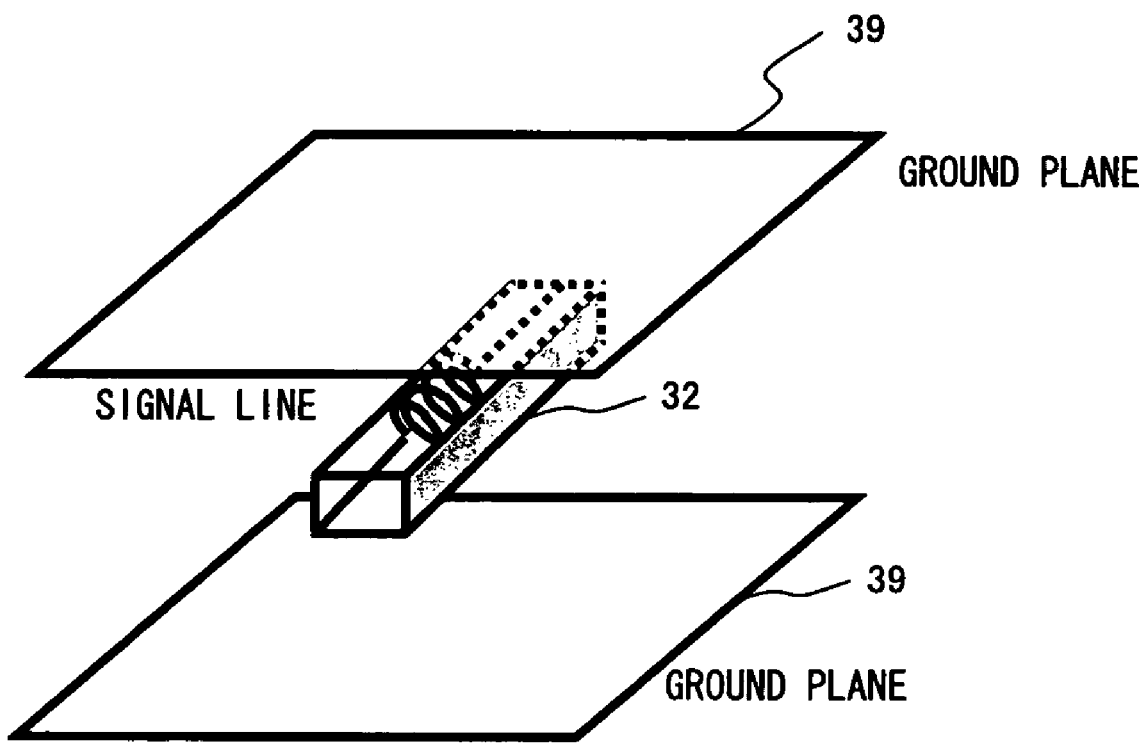
F I G. 6 C

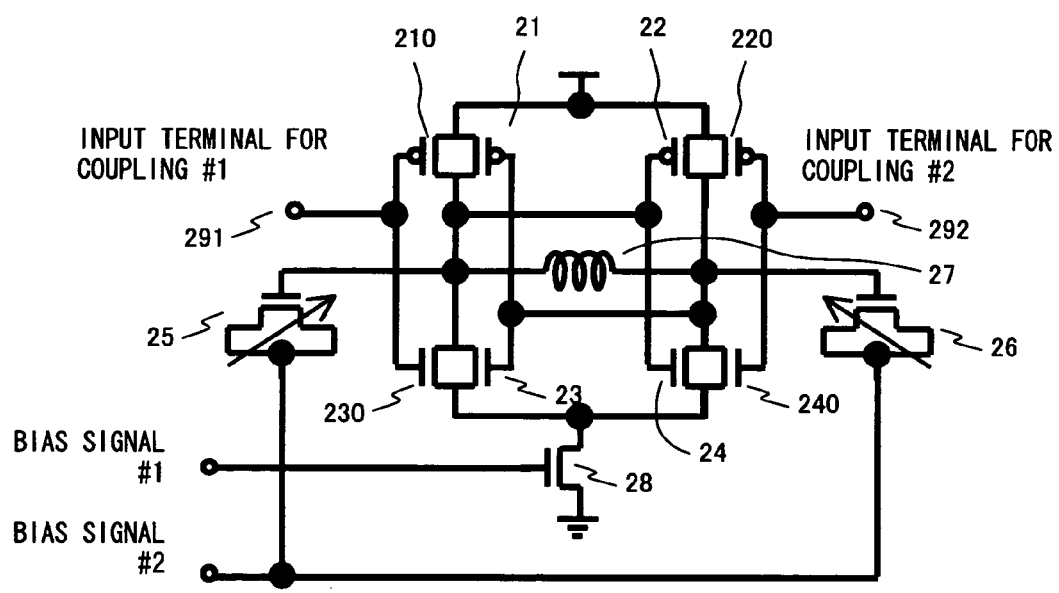
F I G. 1 1 A

# US 7,863,987 B2

CLOCK SIGNAL GENERATING AND DISTRIBUTING APPARATUS

CROSS-REFERENCE TO RELATED APPLICATIONS

This application is based upon and claims the benefit of priority from the prior Japanese Patent Application No. 2005-271058 filed on Sep. 16, 2005, the entire contents of which are incorporated herein by reference.

BACKGROUND OF THE INVENTION

1. Field of the Invention

The present invention relates to an apparatus for generating and distributing a clock signal of high speed and high precision for a high-speed interface circuit, a processor, and an analog or digital circuit that requires a clock signal of a high frequency.

2. Description of the Related Art

In recent years, frequencies of clock signals have been improving with the rapid advance of semiconductor integrated circuits. As a result, a timing constraint condition required for a clock signal has been becoming strict. Furthermore, with an increase in the scale of an LSI, it is also difficult to distribute a clock signal of high precision to each part within a chip.

An example of a conventional configuration that realizes the distribution of a clock signal is shown in FIG. 1. In the configuration example shown in FIG. 1, a clock signal generated by a PLL (100), which is configured by a voltage control oscillator VCO (50), a frequency divider (60), and a phase comparator PFD/charge pump CP/low-pass filter LF block (70), is transmitted to a circuit block (90) through a clock tree (80) configured by buffers (81). In this example, however, the timing precision and the voltage amplitude of a clock signal degrade while the signal passes through the clock tree (80) where the buffers are provided in a plurality of stages. Especially, this problem is significant in a high-frequency region.

A technique proposed by Patent Document 1 to be described below is shown in FIGS. 2 and 3 as a solution to this problem. In this example, a number of VCOs (51) configured by ring oscillators are arranged in each part within a chip. Oscillation nodes of these VCOs (51) are linked with wire conductors one-dimensionally in FIG. 2 and in a matrix in FIG. 3. Additionally, to control the oscillation frequency of each of the VCOs (51), a control signal generated by a PLL, which is configured by VCOs (51), a frequency divider (60), and a phase comparator PFD/charge pump CP/low-pass filter LF block (70), is distributed to each of the VCOs (51). The apparatus implemented by this technique is hereinafter referred to as a "distributive VCO-type clock generating and distributing apparatus".

With the distributive VCO-type clock generating and distributing technique shown in FIGS. 2 and 3, a clock signal is generated by the ring oscillators. However, in usual cases, since ring oscillators are susceptible to power noise and the precision of a generated clock signal is low, this technique is not suitable for use in a high-frequency region of several giga hertz or higher.

Patent Document 1: Japanese Published Patent Application No. H11-74762

SUMMARY OF THE INVENTION

It is therefore an object of the present invention to provide a distributive clock generating and distributing apparatus that can generate and distribute a clock signal of high precision even in a high-frequency region of several giga hertz and higher.

Additionally, a wire that connects oscillation nodes of VCOs is considered to be a length of several 100 μm or longer, and its inductor component cannot be ignored in a high-frequency region reaching 20 GHz, leading to a problem such that the VCOs do not oscillate in the same phase, and a signal of a desired frequency cannot be generated.

Therefore another object of the present invention is to provide a distributive VCO-type clock generating and distributing apparatus, in which VCOs oscillate in the same phase, and which can generate a clock signal of a desired frequency and distribute a clock signal of a high frequency to each part within a chip more stably.

According to the present invention, the distributive VCO-type clock generating and distributing apparatus adopts not ring oscillators but LC resonant voltage control oscillators (hereinafter referred to simply as LC resonant oscillators) as VCOs.

Elements such as a resistor, a buffer, etc., and circuits are inserted between oscillation nodes of LC resonant oscillators, thereby relatively reducing an inductor component of a connecting wire. Or, a wire having a structure of a small inductor component is used as a wire that connects oscillation nodes of LC resonant oscillators, whereby the LC resonant oscillators oscillate in the same phase. Otherwise, the distributive VCO-type clock generating and distributing apparatus adopts a configuration where one or a plurality of LC resonant oscillators, which are connected only to a wire, are arranged on the wire that mutually connects the LC resonant oscillators.

Furthermore, according to the present invention, LC resonant oscillators are oscillated in synchronization by using injection locking.

With the apparatus according to the present invention, a clock signal of high precision can be generated and distributed. Besides, LC resonant oscillators can be oscillated in the same phase and at the same frequency even in an ultra-high-frequency band as high as 20 GHz.

BRIEF DESCRIPTION OF THE DRAWINGS

FIG. 5A shows a configuration example of an LC resonant oscillator;

FIG. 5B shows a relationship between a resistance value of a wire and the stability of oscillation of an LC resonant oscillator;

FIG. 6C shows a modification example 2 of the second preferred embodiment;

FIG. 11A shows a configuration example of an LC resonant oscillator comprising input terminals for coupling;

DESCRIPTION OF THE PREFERRED EMBODIMENTS

Figure 1:
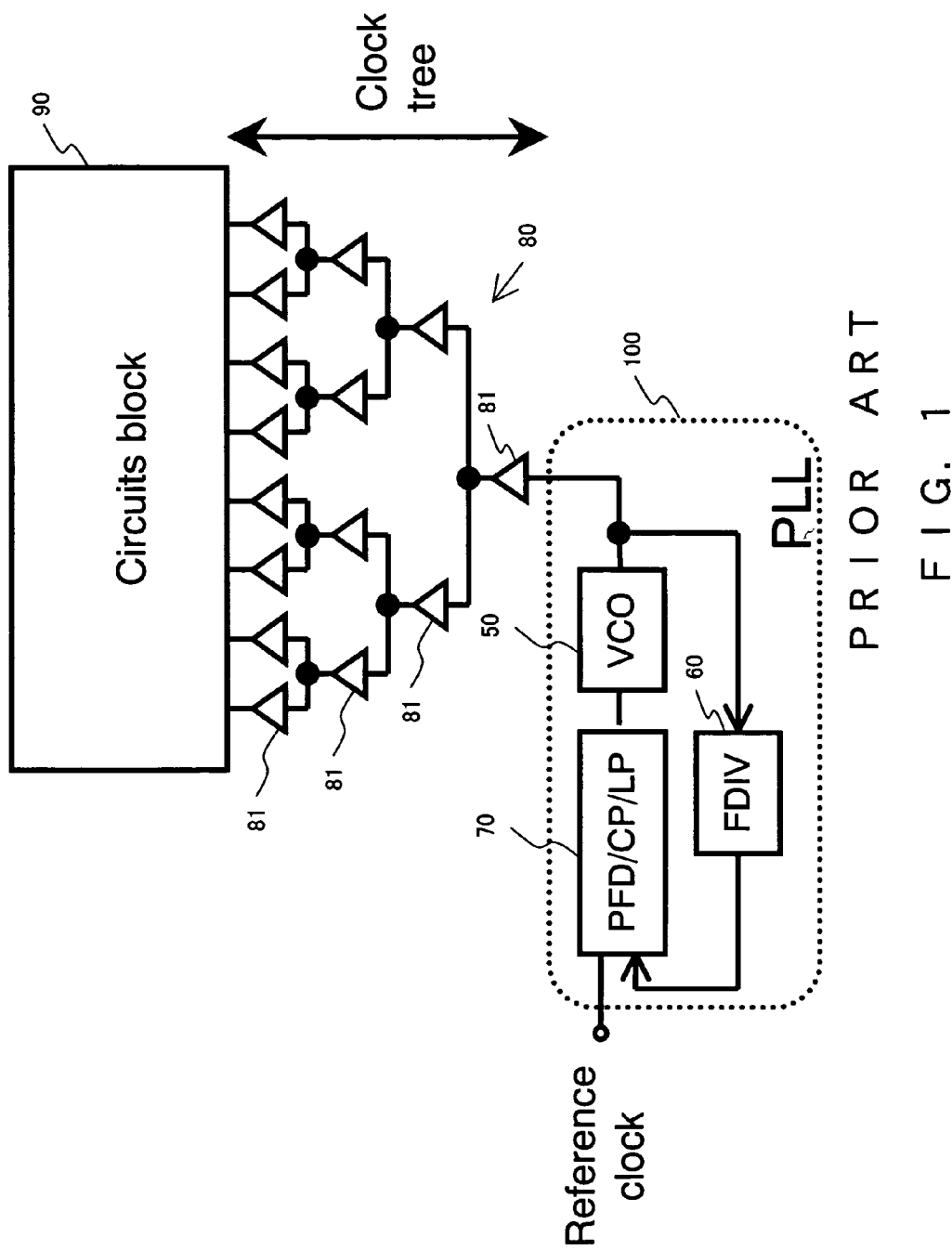
FIG. 1 shows an example of a conventional configuration that realizes the distribution of a clock signal.
Figure 2:
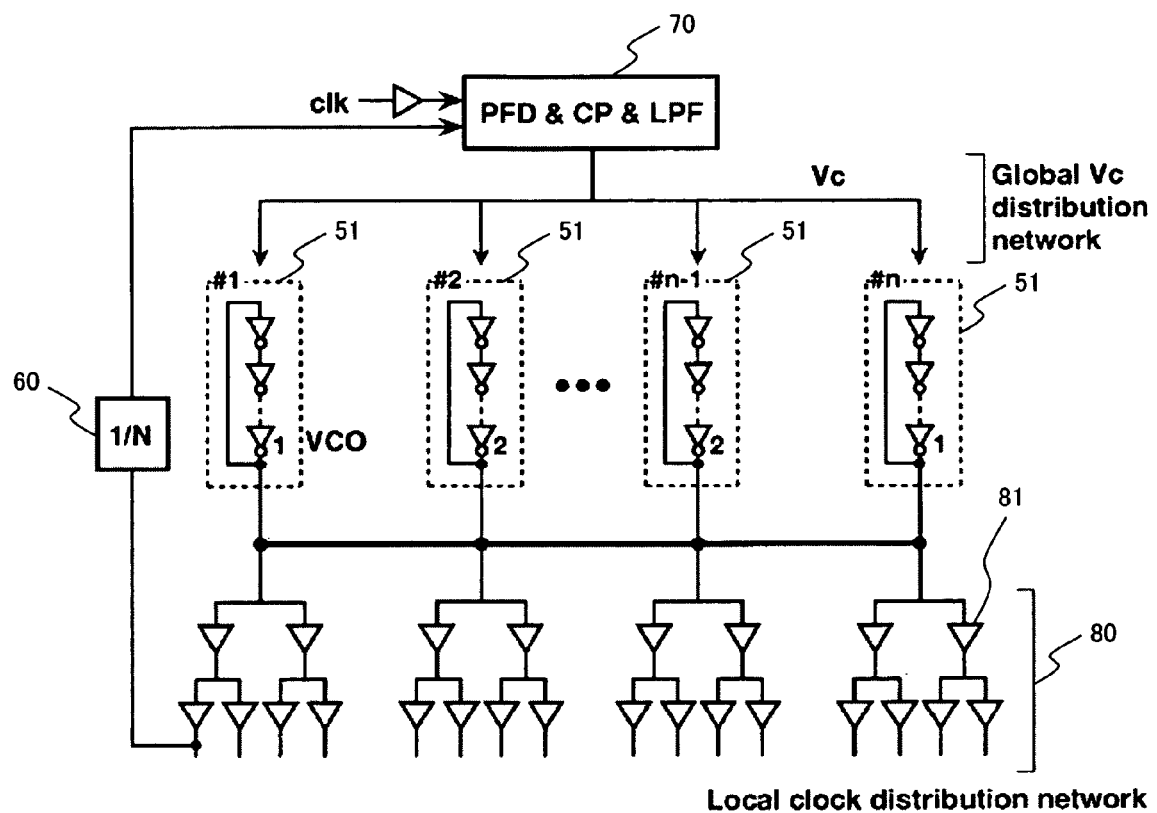
FIG. 2 shows a conventional distributive VCO-type clock generating and distributing technique with which wires are arranged one-dimensionally.
Figure 3:
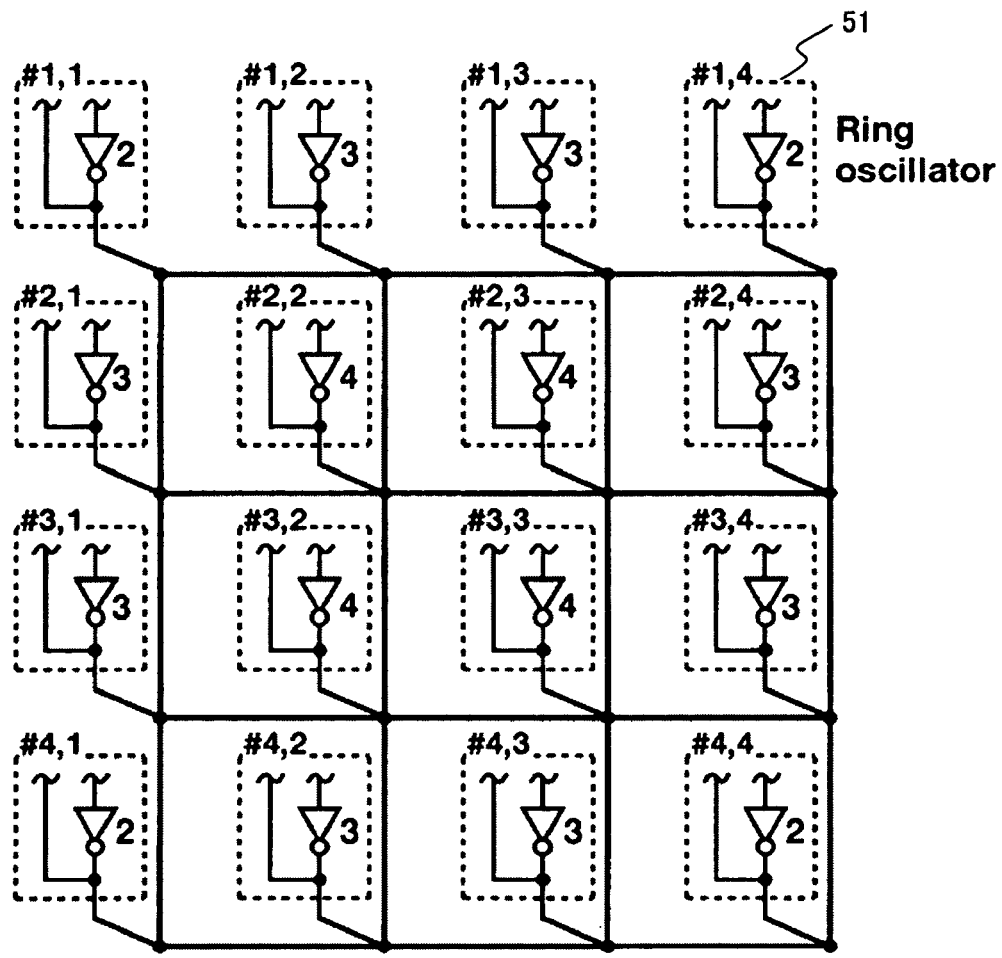
FIG. 3 shows a conventional distributive VCO-type clock generating and distributing technique with which wires are arranged in a matrix.
Figure 4:
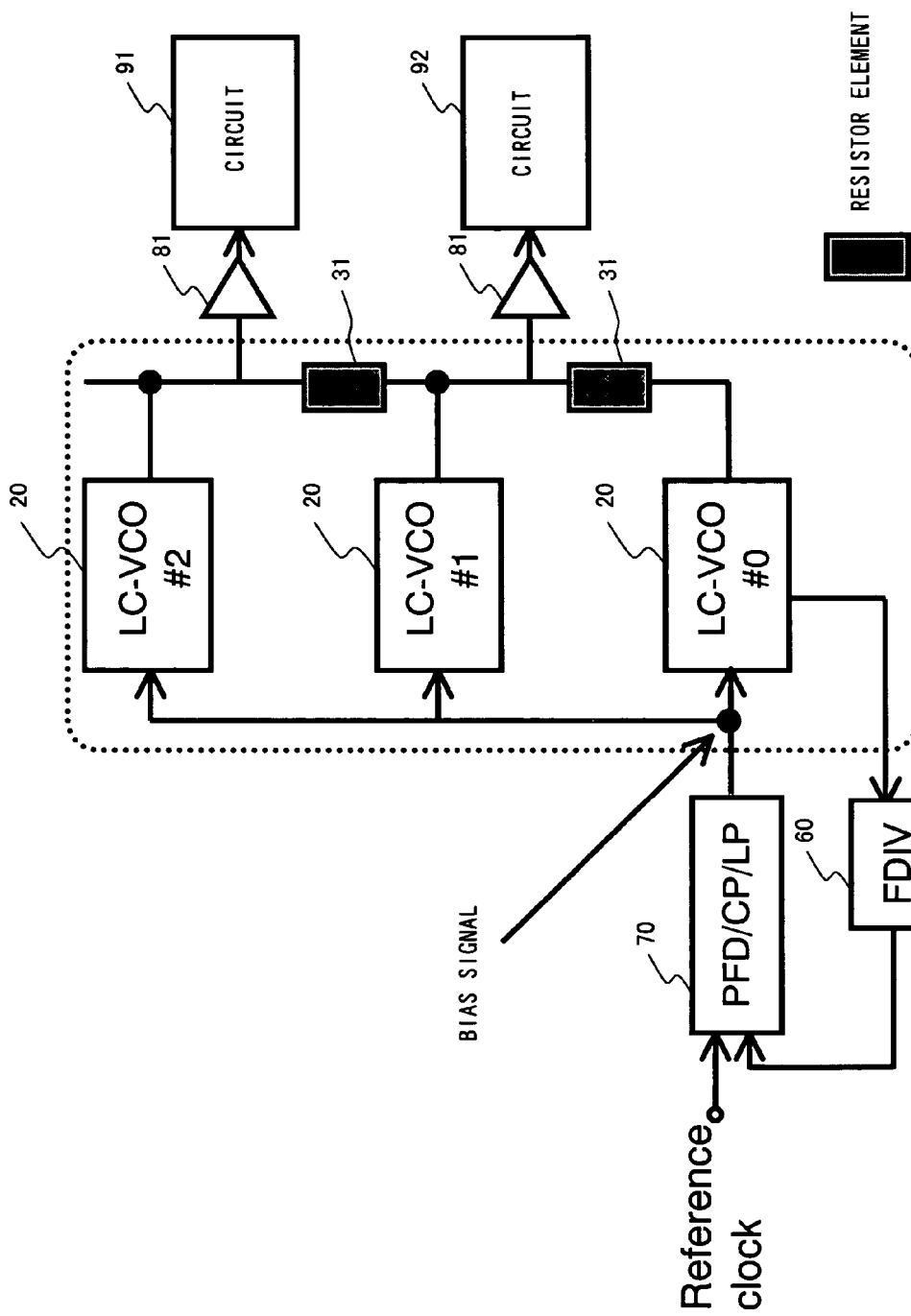
FIG. 4 shows a distributive VCO-type clock generating and distributing technique according to the present invention, and a first preferred embodiment of the present invention.

FIG. 4 shows a distributive VCO-type clock generating and distributing apparatus that adopts LC resonant oscillators as VCOs, and a first preferred embodiment of the present invention according to which the influence of an inductance of a wire between oscillation nodes of LC resonant oscillators (20) is reduced by inserting a resistor element between the oscillation nodes of the LC resonant oscillators (20). In the embodiment shown in this figure, the oscillation nodes of the LC resonant oscillators (20) are connected with a one-dimensional wire. However, the oscillation nodes can be connected also with wires in the shape of a mesh.

This preferred embodiment is configured by LC resonant oscillators #1 (20) and #2 (20), which respectively supply a clock to circuit blocks (91) and (92) via buffers (81) and have the same physical configuration, and a PLL composed of an LC resonant oscillator #0 (20) having the same configuration as the LC resonant oscillators #1 (20) and #2 (20), a frequency divider (60) that feeds back and divides the output of the LC resonant oscillator #0 (20) and a phase comparator PFD/charge pump CP/low-pass filter LP block (70) that makes a phase comparison between the divided output by the frequency divider (60) and a reference clock and supplies a bias signal for oscillation control to the LC resonant oscillators (20), and a resistor element (31) inserted between the oscillation nodes of the LC resonant oscillators (20).

It is evident to a person skilled in the art that an ON resistance of a transistor, or the like is a viable alternative to the resistor element (31). Additionally, in the embodiment shown in FIG. 4, the LC resonant oscillator #0 (20), which configures the PLL, does not distribute any clocks to the circuit blocks. However, the LC resonant oscillator #0 (20) can distribute a clock to a circuit block if the PLL can be arranged close to the circuit block to which a clock is distributed.

A configuration example of an LC resonant oscillator (20) is shown in FIG. 5A.

As shown in this figure, the source of a PMOS transistor (21) and that of a PMOS transistor (22) are connected to a power supply in common. The drain of the PMOS transistor (21) and that of the PMOS transistor (22) are connected to the drain of an NMOS transistor (23) and that of an NMOS transistor (24) respectively. The gate of the PMOS transistor (21) and that of the PMOS transistor (22) are connected to the gate of the NMOS transistor (23) and that of the NMOS transistor (24) respectively. The source of the NMOS transistor (23) and that of the NMOS transistor (24) are connected to the drain of an NMOS transistor (28) in common. The source of the NMOS transistor (28) is connected to a ground. To the gate of the NMOS transistor (28), a bias signal #1, which determines the common mode potential of an oscillation output node, is input. The drain of the PMOS transistor (21) and the gate of the PMOS transistor (22), and the gate of the PMOS transistor (21) and the drain of the PMOS transistor (22) are mutually connected.

Furthermore, an inductance element (27) is connected between the drain of the PMOS transistor (21) and that of the PMOS transistor (22). One of electrodes of a variable capacitive element (25) is connected to the drain of the PMOS transistor (21), whereas one of electrodes of a variable capacitive element (26) is connected to the drain of the PMOS transistor (22). A bias signal #2, which controls the oscillation frequency of the LC resonant oscillator (20), is input to the other electrodes of the variable capacitive elements (25) and (26). This bias signal #2 is equivalent to that shown in FIG. 4.

A resistor value of the resistor element (31) shown in FIG. 4 is described next with reference to FIG. 5B.

FIG. 5B is a graph representing simulation results of an oscillation frequency in a model where two LC resonant oscillators (20) are connected with a wire having a resistor and an inductor. This graph shows a relationship between a resistor value R of the wire between the LC resonant oscillators (20) and the stability of the oscillation of the LC resonant oscillators (20).

Namely, the oscillation frequency is stable at a frequency that slightly exceeds 20 GHz, but it sharply changes at and after an inductor value 0.32 nH when the resistor value R is 15 ohm, and at and after an inductor value 0.67 nH when the resistor value R is 75 ohm.

According to this graph, the oscillation tends to be stable if the resistor value is large relative to the inductor component of the wire. From a different point of view, this graph represents that the oscillation becomes unstable at a certain inductor value or larger while the inductor component of the wire increases relative to a constant resistor value. Accordingly, it can be said that one factor which determines the stability of the oscillation is a ratio of the resistance to the inductance. Besides, the oscillation is proved to become stable if the inductor component of the wire can be substantially reduced relative to a constant resistor value.

As the length of the wire becomes longer, the inductance of the wire and the resistance increase roughly in proportion to the length. Therefore, the value of the resistor to be inserted between the LC resonant oscillators (20) in the first preferred embodiment is determined according to the length of the wire.

Figure 6A:
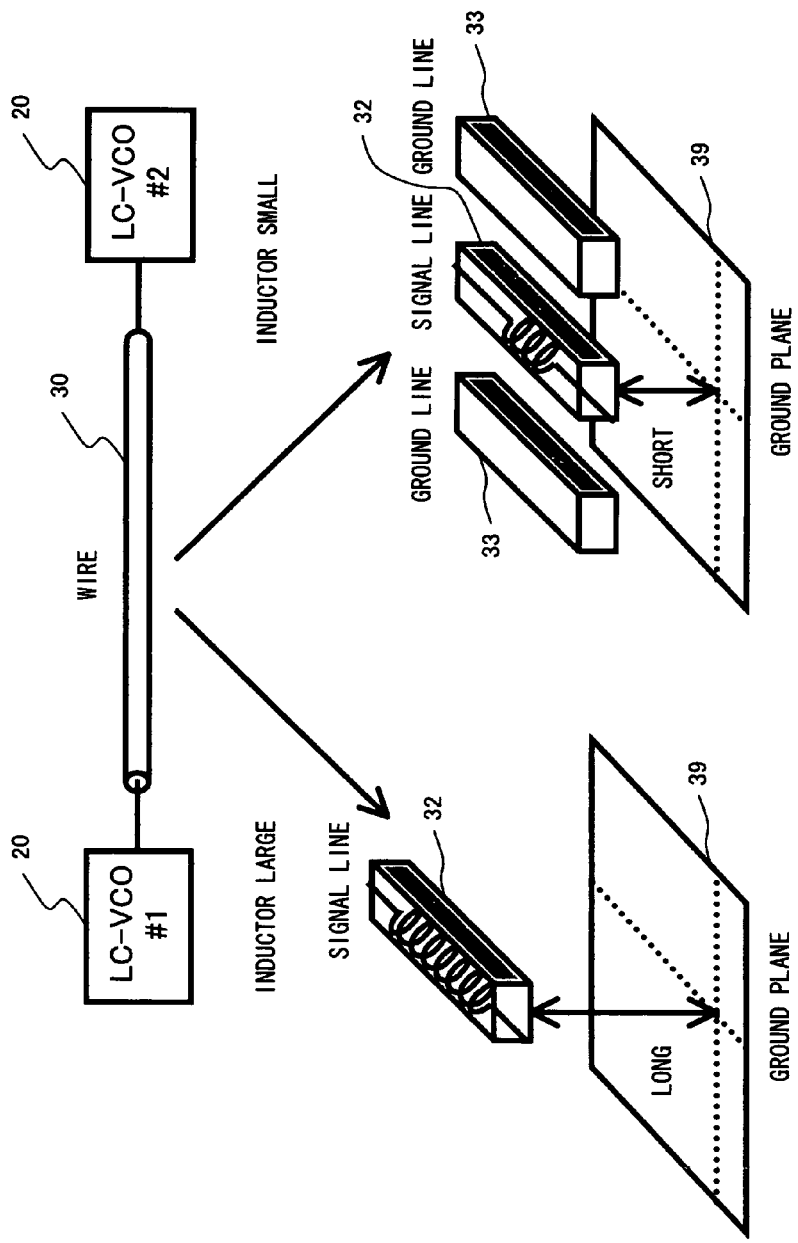
FIG. 6A shows a second preferred embodiment of the present invention.

FIG. 6A explains a second preferred embodiment, a physical structure of which reduces the inductance of a wire (30) that connects oscillation nodes of LC resonant oscillators #1 (20) and #2 (20). Preferably, the structure of the wire (30) that connects the oscillation nodes of the LC resonant oscillators #1 (20) and #2 (20) is a structure where the inductance of the wire becomes small as known from FIG. 5B. Therefore, a distance between a signal line and a ground plane connected to a fixed potential is made short, and ground lines similarly connected to a fixed potential are arranged on both sides of the signal line as shown in this figure.

Figure 6B:
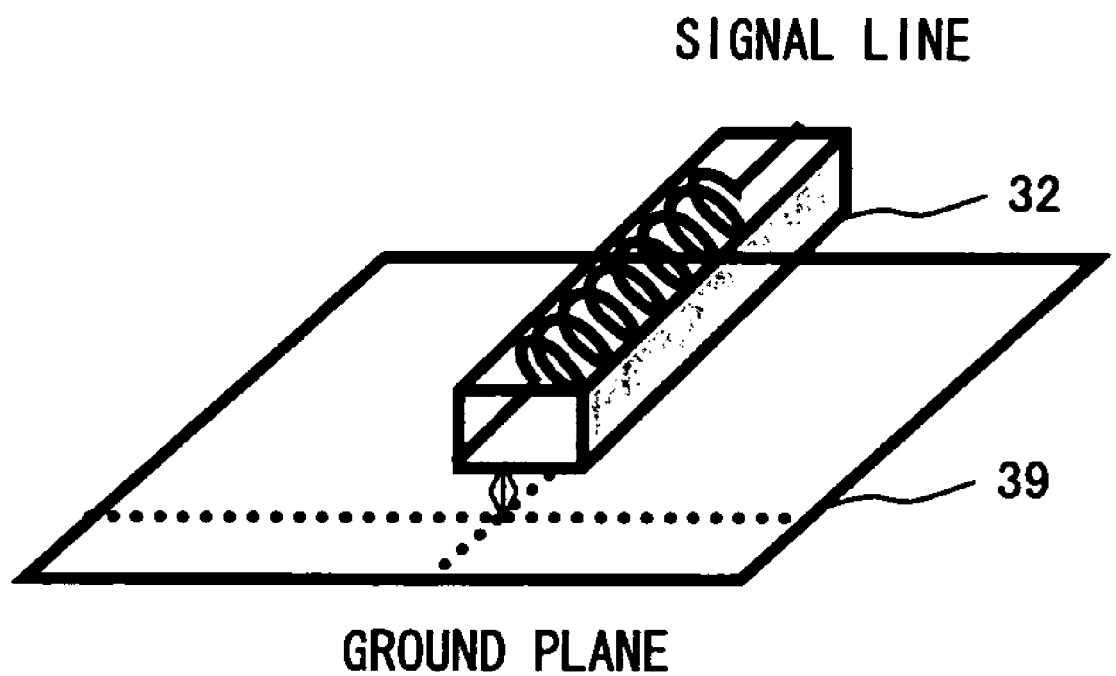
FIG. 6B shows a modification example 1 of the second preferred embodiment.

FIGS. 6B and 6C show modification examples 1 and 2 of the wiring structure shown in FIG. 6A. The modification example 1 shown in FIG. 6B is a structure where a signal line is made extremely close to a ground plane. The signal line itself can be also a micro-strip line as a replacement for the modification example 1 shown in FIG. 6B.

The modification example 2 shown in FIG. 6C is a structure where ground planes are arranged on both sides of a signal line. The signal line itself can be a strip line as a replacement for the modification example 2 shown in FIG. 6C.

Figure 7:
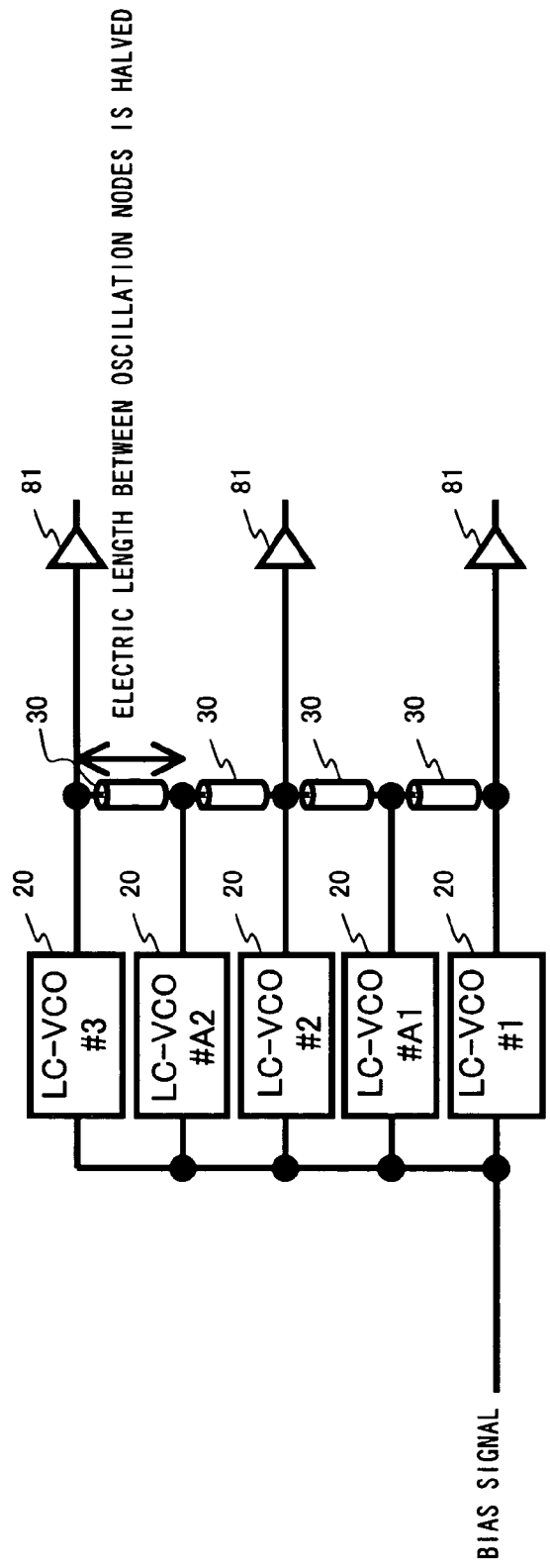
FIG. 7 shows a third preferred embodiment of the present invention.

FIG. 7 shows a third preferred embodiment of the present invention. In this preferred embodiment, auxiliary LC resonant oscillators #A1 (20) and #A2 (20), which have the same configuration as an LC resonant oscillator #1 (20) or the like, are arranged respectively between LC resonant oscillators #1 (20) and #2 (20), and between LC resonant oscillators #2 (20) and #3 (20), and their oscillation nodes are connected. As a result, an electric length between the oscillation nodes can be halved in comparison with a case where the auxiliary LC resonant oscillators #A1 (20) and #A2 (20) are not arranged, whereby an inductance between the oscillation nodes can be reduced.

Figure 8A:
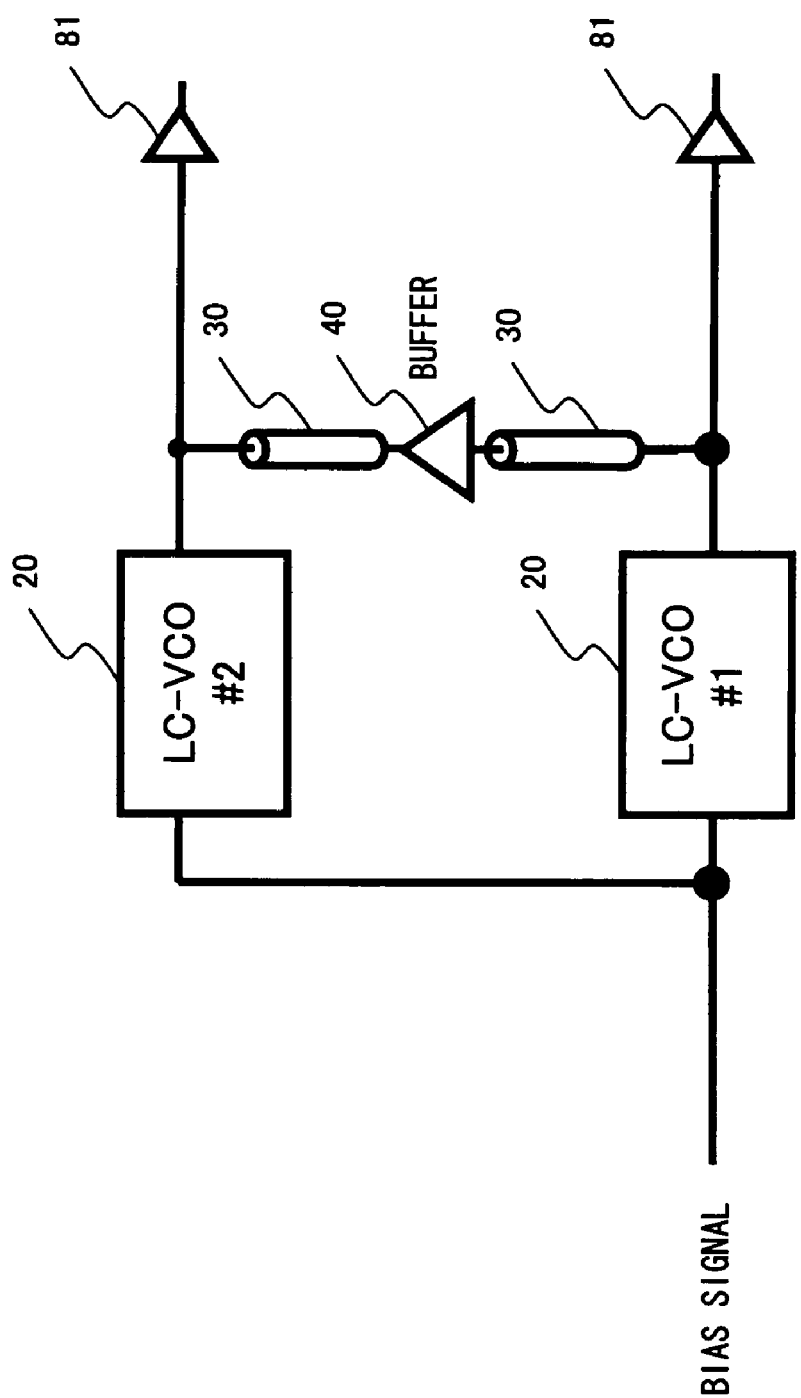
FIG. 8A shows a fourth preferred embodiment of the present invention.

FIG. 8A shows a fourth preferred embodiment of the present invention, in which LC resonant oscillators are oscillated in synchronization by using injection locking. In this preferred embodiment, oscillation nodes of the LC resonant oscillators #1 (20) and #2 (20) are connected via a buffer (40), the LC resonant oscillator #2 (20) is oscillated by using injection locking, and the LC resonant oscillators #1 (20) and #2 (20) are oscillated in the same phase and at the same frequency.

Additionally, in this preferred embodiment, a wire between the oscillation nodes is divided by the buffer, whereby the length of the wire, which exerts an influence on the oscillation of the LC resonant oscillators #1 (20) and #2 (20), becomes short, and the inductance between the oscillation nodes can be reduced in a similar manner as in the third preferred embodiment shown in FIG. 7.

Figure 8B:
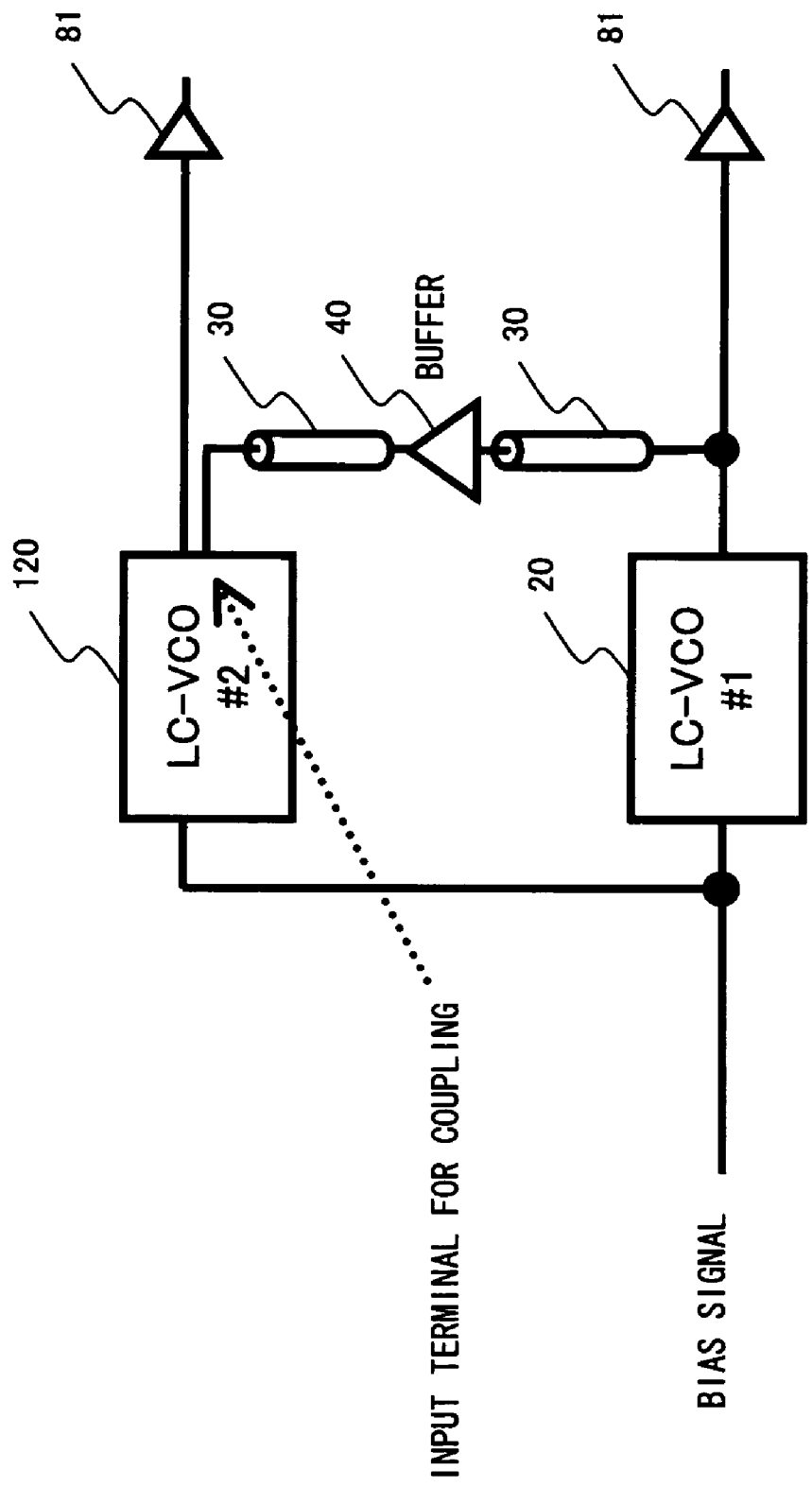
FIG. 8B shows a first modification example of the fourth preferred embodiment.

FIG. 8B shows a first modification example of the configuration shown in FIG. 8A. This example is a configuration where at least one LC resonant oscillator #2 (120) having an input terminal for coupling is used, an oscillation node of an LC resonant oscillator #1 (20) is connected via a buffer (40) to the input terminal for coupling of the LC resonant oscillator #2 (120) having the input terminal for coupling, and an oscillation signal of the LC resonant oscillator #1 (20) is injected to the LC resonant oscillator #2 (120), whereby the LC resonant oscillator #2 (120) is oscillated in the same phase and at the same frequency as the LC resonant oscillator #1 (20).

Figure 9:
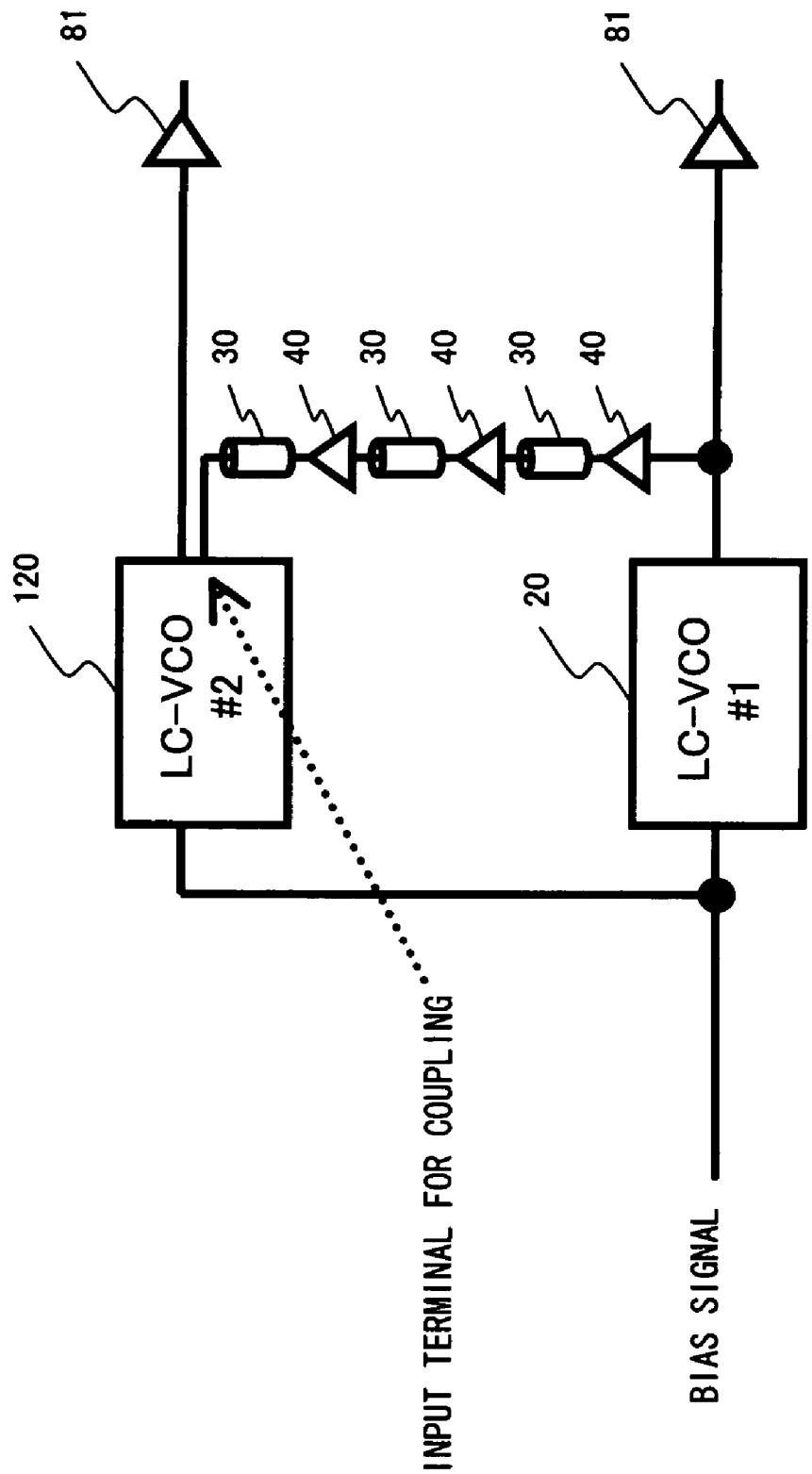
FIG. 9 shows a second modification example of the fourth preferred embodiment.

FIG. 9 shows a second modification example where a plurality of buffers (40) shown in FIG. 8B are provided. As a matter of course, a plurality of buffers (40) can be provided also in the configuration shown in FIG. 8A. The second modification example produces the effect of, for instance, reducing the attenuation of a signal by shortening the substantial length of a wire when the length of the wire, for example, between LC resonant oscillators #1 (20) and #2 (120) to be connected is long.

Figure 10:
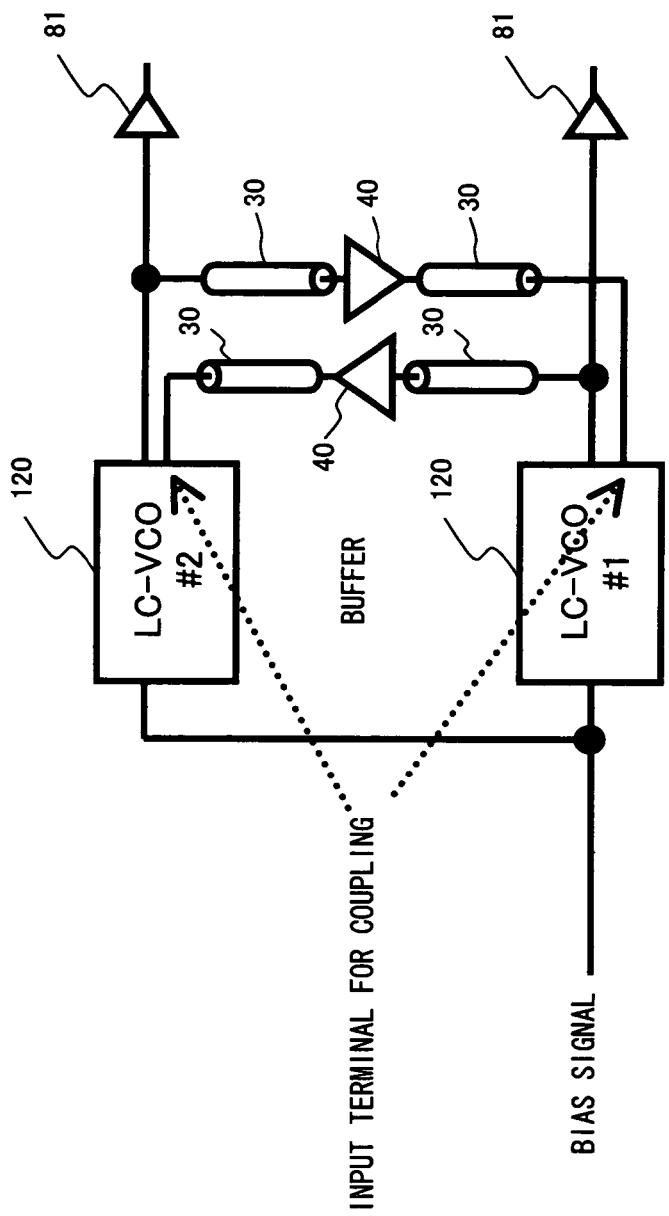
FIG. 10 shows a third modification example of the fourth preferred embodiment.

FIG. 10 shows a third modification example where at least one pair of LC resonant oscillators #1 (120) and #2 (120), which respectively have an input terminal for coupling, is used, and their oscillation nodes and input terminals for coupling are alternately connected via buffers (40) in a symmetrical manner. Such a symmetrical configuration is adopted, whereby a clock of higher precision can be distributed to each circuit block. Accordingly, it is effective to apply this modification example, for instance, to synchronization between the LC resonant oscillators #1 (120) and #2 (120) that supply a clock to circuit blocks operations of which require a clock of high precision.

FIG. 11A shows a configuration example of an LC resonant oscillator (120) having input terminals for coupling. This example is a configuration where a serial circuit of a PMOS transistor (210) and an NMOS transistor (230), and a serial circuit of a PMOS transistor (220) and an NMOS transistor (240) are respectively connected in parallel to the serial circuit of the PMOS transistor (21) and the NMOS transistor (23), and the serial circuit of the PMOS transistor (22) and the NMOS transistor (24) of the LC resonant oscillator (20) shown in FIG. 5A, and the input terminals for coupling #1 (291) and #2 (292), which are intended to inject those oscillation signals as a differential signal, are provided at a connecting point of the PMOS transistor (210) and the NMOS transistor (230), and a connecting point of the PMOS transistor (220) and the NMOS transistor (240) respectively.

Figure 11B:
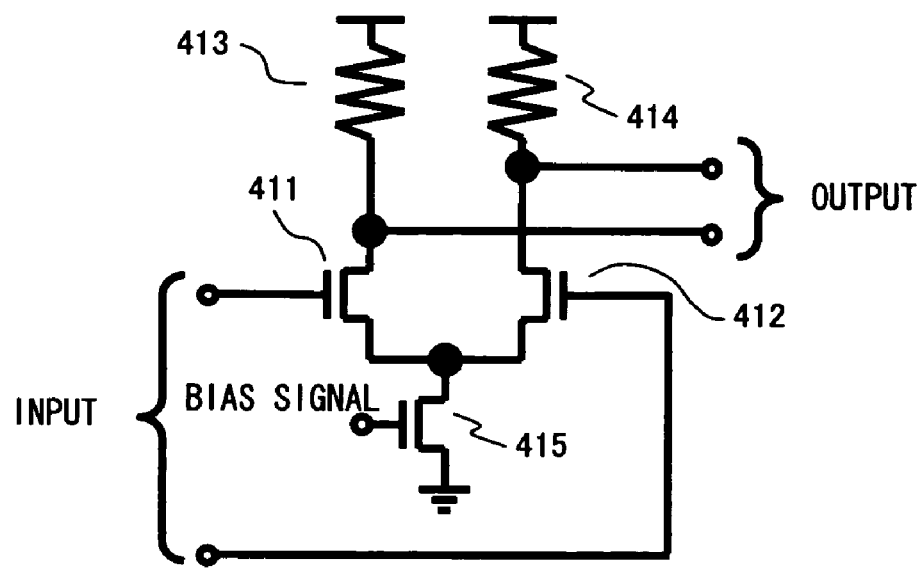
FIG. 11B shows a configuration example 1 of a buffer circuit used by the present invention.

FIG. 11B shows a configuration example 1 of a preferable buffer circuit used by the present invention. As shown in this figure, the drains of NMOS transistors (411) and (412) are connected to a power supply via resistor elements (413) and (414) respectively, and their sources are connected to the drain of an NMOS transistor (415) in common. The source of the NMOS transistor (415) is connected to a ground, and a bias signal which determines the common mode potential of a buffer output is input to the gate of the NMOS transistor (415).

Input terminals are provided at the gates of the NMOS transistors (411) and (412), whereas output terminals are provided at the drains of the NMOS transistors (411) and (412).

Figure 11C:
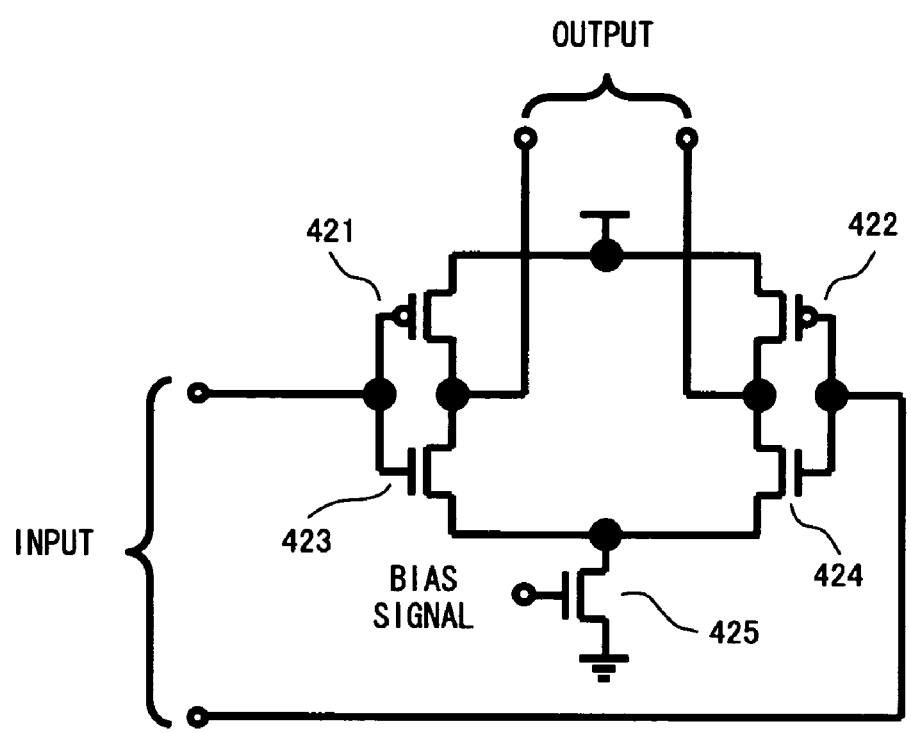
FIG. 11C shows a configuration example 2 of the buffer circuit used by the present invention.

FIG. 11C shows a configuration example 2 of a preferable buffer circuit used by the present invention. As shown in this figure, a serial circuit of a PMOS transistor (421) and an NMOS transistor (423), gates of which are connected, and a serial circuit of a PMOS transistor (422) and an NMOS transistor (424), gates of which are connected in a similar manner, are connected in parallel between a power supply and the drain of an NMOS transistor (425). The source of the NMOS transistor (425) is connected to a ground, and a bias signal which determines the common mode potential of a buffer output is input to the gate of the NMOS transistor (425).

Input terminals are provided at a connecting point of the gates of the PMOS transistor (421) and the NMOS transistor (423), and a connecting point of the gates of the PMOS transistor (422) and the NMOS transistor (424), whereas output terminals are provided at a connecting point of the drains of the PMOS transistor (421) and the NMOS transistor (423), and a connecting point of the drains of the PMOS transistor (422) and the NMOS transistor (424).

Note that the configurations shown in FIGS. 5A, 11A, 11B, and 11C are merely circuit examples. It is evident to a person skilled in the art that a variety of modification examples can be adopted other than the exemplified configurations.

What is claimed is:

1. A clock signal generating and distributing apparatus, comprising:
   a PLL for generating a voltage control signal;
   a first LC resonant voltage control oscillator, which is controlled by the voltage control signal, for generating a first oscillation signal at a first oscillation node, the first LC resonant voltage control oscillator having a first input terminal for coupling;
   a second LC resonant voltage control oscillator, which is controlled by the voltage control signal, for generating a second oscillation signal at a second oscillation node, the second LC resonant voltage control oscillator having a second input terminal for coupling;
   a first wire for connecting the second oscillation node and the first input terminal for coupling;
   a first buffer located on the first wire;
   a second wire for connecting the first oscillation node and the second input terminal for coupling; and
   a second buffer located on the second wire,
   wherein a ratio of a resistance of the first wire to an inductance of the first wire is determined such that the first LC resonant voltage control oscillator and the second LC resonant voltage control oscillator are oscillated in the same phase, wherein the first LC resonant voltage control oscillator on an output side of the first buffer is synchronized with the second LC resonant voltage control oscillator on an input side of the first buffer via injection locking, and wherein the second LC resonant voltage control oscillator on an output side of the second buffer is synchronized with the first LC resonant voltage control oscillator on an input side of the second buffer via injection locking.

* * * * *